(12) United States Patent
Murakami et al.

(10) Patent No.: US 10,490,240 B2
(45) Date of Patent: Nov. 26, 2019

(54) SEMICONDUCTOR MEMORY DEVICE CAPABLE OF CORRECTLY READING DATA

(71) Applicant: Winbond Electronics Corp., Taichung (TW)

(72) Inventors: Hiroki Murakami, Taichung (TW); Hidemitsu Kojima, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/013,349

(22) Filed: Jun. 20, 2018

(65) Prior Publication Data

US 2018/0366201 A1    Dec. 20, 2018

(30) Foreign Application Priority Data

Jun. 20, 2017    (JP) ................. 2017-120184

(51) Int. Cl.
| | |
|---|---|
| *G11C 16/26* | (2006.01) |
| *G11C 7/22* | (2006.01) |
| *G11C 7/12* | (2006.01) |
| *G11C 7/08* | (2006.01) |
| *G11C 16/34* | (2006.01) |

(52) U.S. Cl.
CPC ............... *G11C 7/22* (2013.01); *G11C 7/08* (2013.01); *G11C 7/12* (2013.01); *G11C 16/26* (2013.01); *G11C 16/3436* (2013.01); *G11C 16/3459* (2013.01); *G11C 2207/005* (2013.01); *G11C 2207/2281* (2013.01)

(58) Field of Classification Search
CPC ....... G11C 16/26; G11C 29/026; G11C 29/16; G11C 29/028; G11C 16/0483; G11C 7/106; G11C 7/1039; G11C 16/3459; G11C 7/08; G11C 7/22; G11C 7/12; G11C 16/3436; G11C 16/32; G11C 7/1021; G11C 2207/005; G11C 2207/2281

See application file for complete search history.

(56) References Cited

U.S. PATENT DOCUMENTS

| | | | |
|---|---|---|---|
| 7,263,003 B2 | 8/2007 | Edahiro | |
| 9,418,730 B2 | 8/2016 | Gotterba | |
| 9,424,941 B2 * | 8/2016 | Kim | ....................... G11C 16/26 |
| 2005/0057995 A1 | 3/2005 | Mitani et al. | |
| 2015/0200015 A1 | 7/2015 | Kim | |

FOREIGN PATENT DOCUMENTS

| | | |
|---|---|---|
| JP | 2003151281 A | 5/2003 |
| JP | 2006302341 A | 11/2006 |

* cited by examiner

*Primary Examiner* — David Lam
(74) *Attorney, Agent, or Firm* — Muncy, Geissler, Olds & Lowe, P.C.

(57) ABSTRACT

A semiconductor memory device is provided. The semiconductor memory device includes a maintaining circuit, a sensing circuit, an output circuit, and a verification circuit. The maintaining circuit is configured to maintain data read from a memory cell array and output the data to a data bus in response to a column selection signal. The sensing circuit is configured to sense the data on the data bus in response to at least one sensing enable signal. The output circuit is configured to output the data sensed by the sensing circuit. The verification circuit is configured to verify an operation margin of the sensing circuit and output a verification result. The timing of the at least one sensing enable signal is set according to the verification result of the verification circuit.

13 Claims, 9 Drawing Sheets

SEMICONDUCTOR MEMORY DEVICE CAPABLE OF CORRECTLY READING DATA

CROSS REFERENCE TO RELATED APPLICATIONS

This application claims the benefit of Japan Application No. 2017-120184, filed on Jun. 20, 2017, the contents of which are incorporated herein by reference.

BACKGROUND OF THE INVENTION

Field of the Invention

The invention relates to a semiconductor memory device, and more particularly, to a method for determining read timing of a NAND flash memory.

Description of the Related Art

In a NAND flash memory, a page read operation is performed by maintaining the page data selected from a memory cell array in a page buffer and then sequentially outputting the data maintained in the page buffer. In order to improve the data reading speed, a conventional flash memory (for example, Japanese Patent Publication No. 2006-302341) reads multi-value data at a high speed by detecting the current difference between a cell selected from a memory cell array and a reference cell.

FIG. 1 is a schematic diagram showing a read operation of a NAND flash memory. In the read operation, a page of the memory cell array is selected according to a row address, and data "0" or "1" of the selected page is maintained in a page buffer 10. For example, the page buffer 10 can comprise two stages of latch circuits internally to perform pipeline processing on the data. A column decoder 20 decodes a column address CA and outputs a column selection signal YS to a column selection circuit (not shown) through a driver 22, wherein the column selection signal YS is applied to select n-bit data from the page data maintained in the page buffer 10. The column selection circuit selects n-bit data from the page data maintained in the latch circuit of the page buffer 10 by using the column selection signal YS. The selected n-bit data represents the differential data of "0" and "1" and is output to a bit-line pairs BT/BB of the data bus 40.

The n-bit bit-line pairs BT/BB are connected to n differential sensing amplifiers (S/A) 30. The n differential sensing amplifiers 30 are enabled by the enable signal SAE from a timing control circuit 50 through a driver 52. When the differential sensing amplifiers 30 are enabled, the differential sensing amplifiers 30 detect (sense) the differential data of the corresponding bit-line pairs BT/BB. The n-bit data sensed by the differential sense amplifiers 30 is transmitted to an input/output circuit 60.

The input/output circuit 60 comprises a parallel/serial conversion circuit which is connected to n flip-flops (FF). The parallel/serial conversion circuit converts the n-bit data sensed by the differential sense amplifiers 30 to m-bit serial data in response to an internal clock signal PSCCLK. The converted serial data is output to the outside from the m-bit input/output terminals I/O via the driver 62.

The timing control circuit 50 generates the clock signal PSCCLK, which is synchronized with the system clock signal CLK, through a driver 54 and the enable signal SAE which is asynchronous to the system clock signal CLK. Further, the timing control circuit 50 controls the timing of the column selection signal YS generated by the column decoder 20.

The number n of bits selected by the column decoder 20 at one time is equal to the bit width of the data bus 40. That is, the number of bit-line pairs BT/BB. Although the number of input/output terminals is arbitrary, when the number of input/output terminals (I/O) is equal to the number of m bits, m ≤n and n is k times m (each of m and k is an integer greater than 1). When m is smaller than n, the n bits of the data bus 40 are output from the input/output circuit 60 by using the several cycles of the clock signal PSCCLK. For example, if the bit-line pairs BT/BB of the data bus 40 is for 8 bits and the number of input/output terminals (I/O) is 4, 4-bit data among the 8-bit data is sensed by the differential sense amplifier 30 in the first cycle of the clock signal PSCCLK and output simultaneously from the four (4) input-terminal terminals (I/O) as 4-bit serial data from the input/output circuit 60. In the second cycle of the clock signal PSCCLK, the remaining 4 bits are output simultaneously from the four (4) input-terminal terminals (I/O) as 4-bit serial data converted by the input/output circuit 60. The manner of selecting 4-bit data is arbitrary. For example, four even bits of the data bus 40 are selected first, and then four odd bits are selected, or the four upper bits of the data bus 40 are selected first, and then the four lower bits are selected.

FIG. 2 shows a timing chart of a read operation of the NAND flash memory. In the example, the number of input-terminal terminals (I/O) is 4 (m=4) and the data bus 40 is 8 bits (n=8). In a page read mode, the column address is automatically incremented by an address counter, and the next n-bit data is fetched from the page buffer 10 to the data bus 40 in response to the increment. In page read operation, it is possible to continuously output whole data for one page or to output some data of one page.

At time t0, the system clock signal CLK is input. At time t1 which is delayed from the system clock signal CLK by a predetermined time, the column selection signal YS is output to the column selection circuit. The column selection circuit selects 8-bit data from the data of one page maintained in the page buffer 10. The selected 8-bit data is output as differential data to the n-bit bit-line pairs BT/BB of the data bus 40.

The n-bit bit-line pairs BT/BB are connected to a plurality of latch circuits of the page buffer 10 through a plurality of column selection transistors of the column selection circuit. The column selection transistors selected by the column selection signal YS are turned on, so that the latch circuits are electrically connected to the corresponding bit-line pairs BT/BB. Since the physical wiring of one bit-line pairs BT/BB is configured according to the number of latch circuits connected with the bit-line pair BT/BB, the wiring capacitance and the wiring resistance of the bit-line pair BT/BB are relatively large, and one differential sense amplifier 30 is used for sensing data. Therefore, it takes a predetermined time until one bit-line pair BT/BB reaches a predetermined potential difference or more that the corresponding differential sensing amplifier 30 can sense the data.

The timing control circuit 50 outputs the enable signal SAE at time t2 when the potential differences of respective the bit-line pairs BT/BB can be sensed by the differential sensing amplifiers 30. The differential sensing amplifiers 30 senses the data [7:0] of the bit-line pairs BT/BB of the data bus 40 in response to the rising edge of the enable signal SAE.

Next, at time t3, the timing control circuit 50 outputs the first cycle of the clock signal PSCCLK, wherein the clock signal PSCCLK is obtained by delaying the system clock signal CLK by a predetermined time. In response to the rising edge of the clock signal PSCCLK, the input/output circuit 60 converts the 4-bit data D1[7:4] selected from the 8-bit data sensed by the differential sensing amplifiers 30 into serial data and outputs it from the four input-terminal terminals (I/O) at the same time. Next, at time t4, the second cycle of the clock signal PSCCLK is output to the input/output circuit 60 The input/output circuit 60 outputs the remaining 4-bit data D1[3:0] sensed by the differential sense amplifier 30s into serial data and outputs it from the four input-terminal terminals (I/O) at the same time.

Since the differential sense amplifiers 30 need to be enabled when the potential differences of the bit-line pairs BT/BB become equal to or greater than a predetermined value, the timing of the enable signal can be set within a predetermined margin. However, the operation environment of the flash memory is varied (for example, variation in the power supply voltage and operating temperature), and, thus, the set margin is not appropriate, meaning that correct data cannot be loaded into the input/output circuit 60 and it is possible to output wrong data.

BRIEF SUMMARY OF THE INVENTION

In order to solve the problems of the prior art as described above. The present invention provides a semiconductor memory device capable of correctly reading data.

An exemplary embodiment of a semiconductor memory device is provided. The semiconductor memory device comprises a maintaining circuit, a sensing circuit, an output circuit, and a verification circuit. The maintaining circuit is configured to maintain data read from a memory cell array and output the data to a data bus in response to a column selection signal. The sensing circuit is configured to sense the data on the data bus in response to at least one sensing enable signal. The output circuit is configured to output the data sensed by the sensing circuit. The verification circuit is configured to verify an operation margin of the sensing circuit and output a verification result. The timing of the at least one sensing enable signal is set according to the verification result of the verification circuit.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Hereinafter, embodiments of the present invention will be described in detail with reference to the drawings. The flash memory disclosed in a preferred embodiment of the present invention is a NAND type and may or may not comprise a serial interface. When it comprises a serial interface, the flash memory further comprises a terminal for inputting a serial clock signal, and the inputting/outputting of the data is in synchronization with the serial clock signal.

Figure 3A:
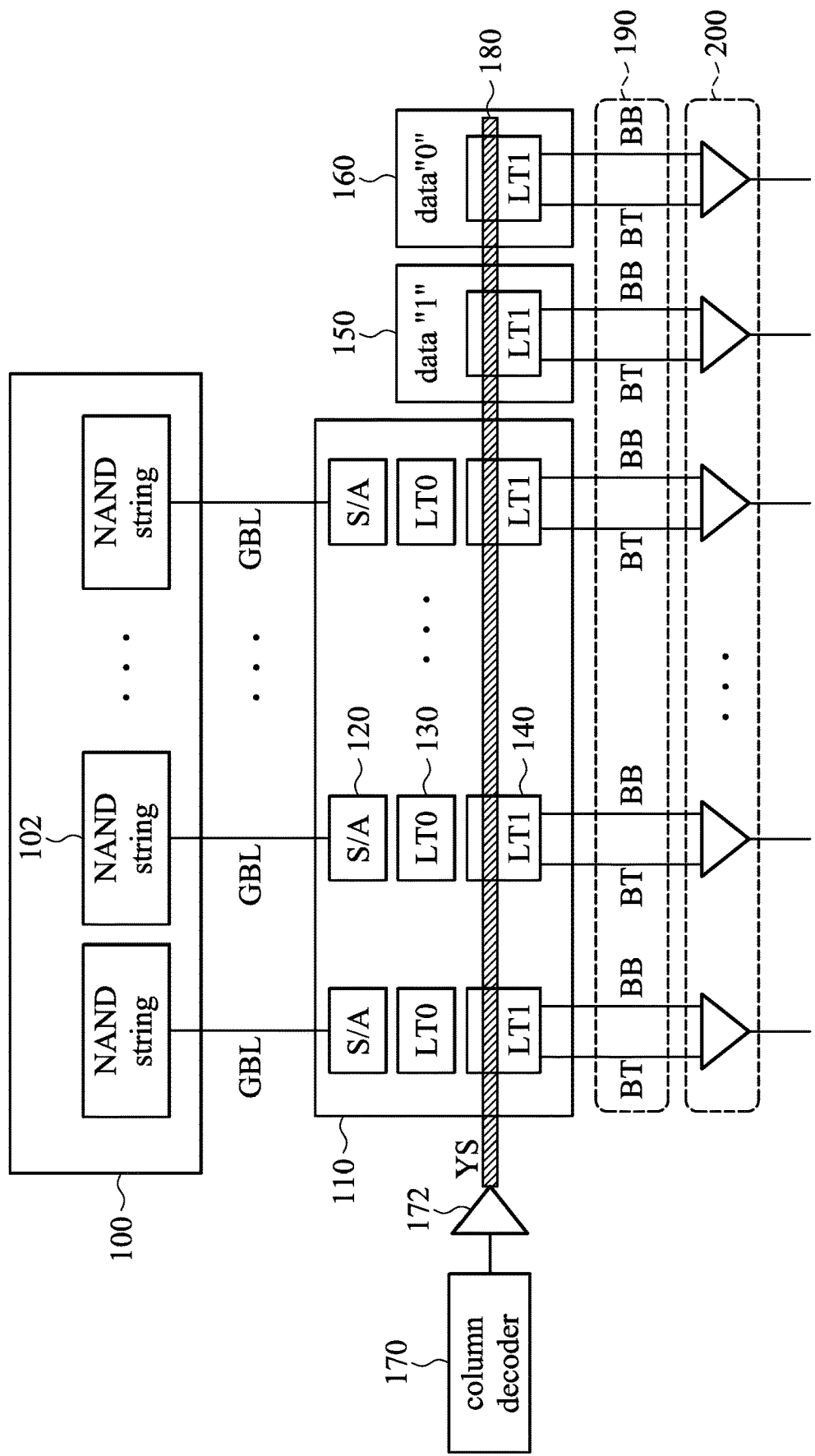
FIG. 3A shows a schematic diagram showing a structure of a flash memory related to a read operation according to a first embodiment of the present invention.
Figure 4:
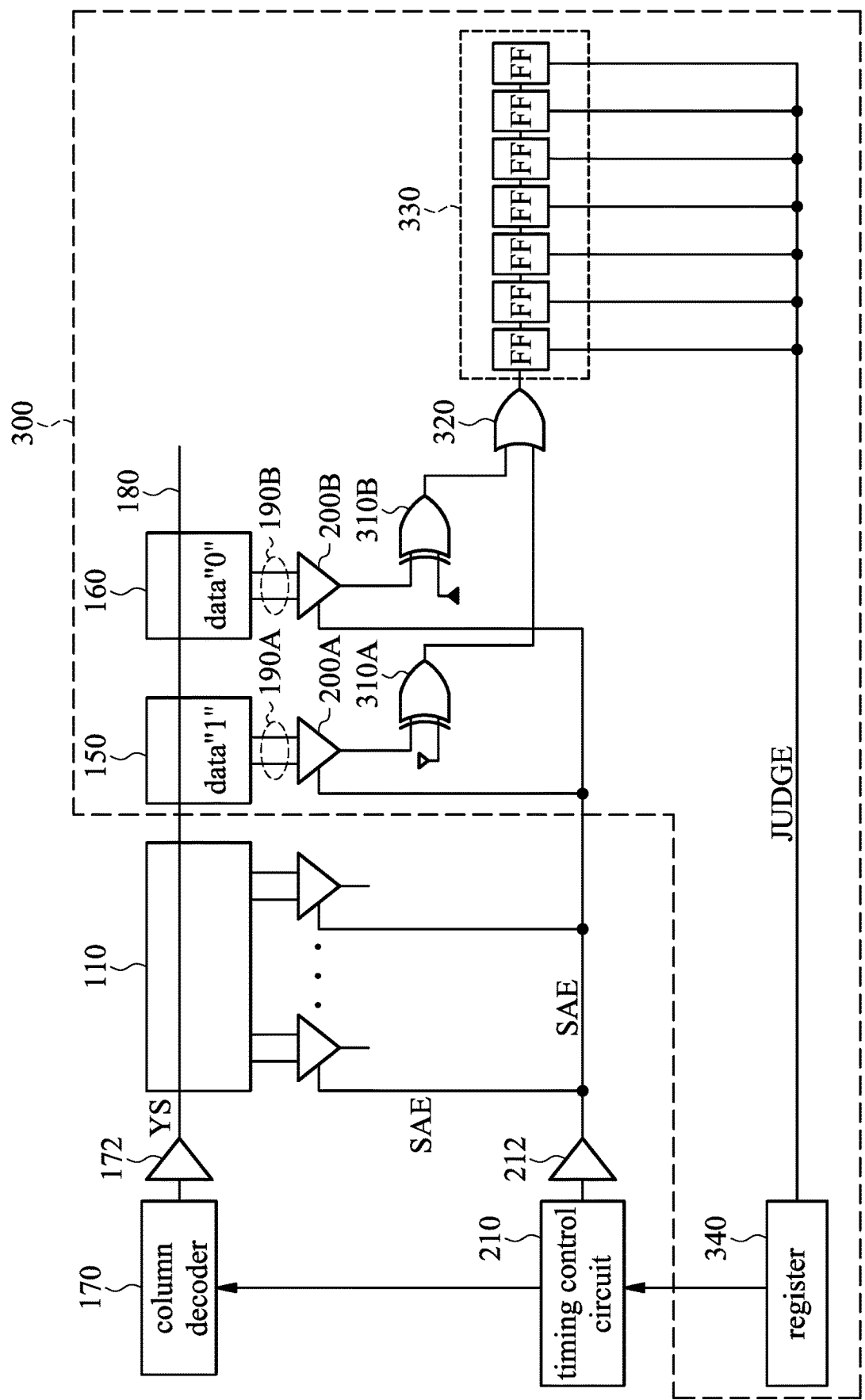
FIG. 4 is a schematic diagram showing a circuit for verifying differential sensing amplifiers in the flash memory according to the first embodiment of the present invention.

FIGS. 3A and 4 show the main part of a flash memory according to a first embodiment of the present invention. The configuration not shown here is the same as that of typical NAND flash memories.

A memory cell array 100 comprises a plurality of blocks which are formed by a plurality of NAND strings. The NAND string 102 of each block of the memory cell array 100 is connected to the page buffer 110 via a corresponding global bit line GBL. The page buffer 110 comprises a plurality of sensing amplifiers 120 connected to all the global bit lines GBL for one page, a plurality of latch circuits (LT0) 130 connected to the plurality of sensing amplifiers 120, and a plurality of latch circuits (LT1) 140 connected to the plurality of latch circuits 130. In a read operation, the sensing amplifiers 120 sense data of memory cells of the memory cell array 100 selected by a selection word line, and the sensed data is maintained in the latch circuits 130. The latch circuits 140 and 130 form a pipeline of two stages. Accordingly, while the latch circuits 140 outputs the data maintained herein, the next read data is maintained in the latch circuits 130.

Furthermore, two duplication circuits 150 and 160 which is configured to duplicate the latch circuits (LT1) 140 are comprised in the embodiment. The duplication circuit 150 is a latch circuit for maintaining data "1", and the duplication circuit 160 is a latch circuit for maintaining data "0". In a preferred embodiment, the duplication circuits 150 and 160 fixedly maintain data "1" and "0" irrespective of the memory cell array 100. Therefore, the duplication circuits 150 and 160 are not connected to the memory cell array 100 via the global bit lines GBL. In another preferred embodiment, the duplication circuits 150 and 160 may maintain data read from the memory cell array 100. In this case, data "1" is maintained in one of the duplication circuits 150 and 160, and data "0" is maintained in the other of the duplication circuits 150 and 160. Alternatively, in another preferred embodiment, the duplication circuits 150 and 160 may be configured to maintain data "1" and data "0" output by a control circuit (not shown) during a test operation.

Figure 3B:
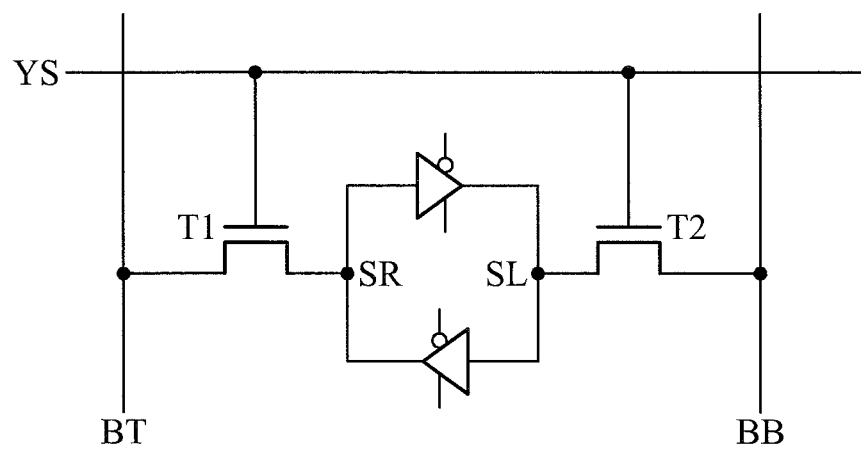
FIG. 3B shows an exemplary embodiment of a latch circuit.

The latch circuits 140 of the page buffer 110 and the duplication circuits 150 and 160 are connected to the data bus 190. In response to a column selection signal YS output from a column decoder 170 through a driver 172, the data maintained in the latch circuits 140 and the duplication circuits 150 and 160 is output to the data bus 190. The data bus 190 comprises a plurality of bit-line pairs BT/BB which are configured to transmit the data output from the page buffer 110 and the data output from the duplicating circuits 150 and 160. FIG. 3B shows an exemplary embodiment of a latch circuit that maintains 1-bit data. The latch circuit maintains the complementary data in a pair of storage nodes SR and SL. The storage node SR is connected to the bit line BT through a transistor T1, and the storage node SL is connected to the bit line BB through a transistor T2. The gates of the transistors T1 and T2 are connected to the column selection signal YS. When the transistors T1 and T2 of the selected latch circuit are turned on, the complementary data maintained in the latch circuit is output to the bit-line pair BT/BB.

The column selection signal YS of the column decoder 170 is transmitted by a wiring 180 which is composed of a metal extending in the direction of the latch circuit 140 and the duplication circuits 150 and 160. In the preferred embodiment, the duplication circuits 150 and 160 are arranged at the farthest end of the wiring 180 where the physical distance from the output node of the column selection signal YS is the longest. The latency characteristic of the column selection signal YS becomes the worst at the farthest end of the wiring 180. Moreover, due to the load capacitance and the load resistance of the wiring 180, the attenuation of the column selection signal YS at the farthest end becomes more serious compared to that at the near end, and the responses of the transistors T1 and T2 of the latch circuits are delayed. Therefore, the potential differences of the bit-line pairs BT/BB at the far end of the wiring 180 are smaller than that at the near end thereof. By placing the duplication circuits 150 and 160 at the farthest end of the column selection signal YS, the worst characteristic of the latency of the column selection signal YS is realized.

Figure 3C:
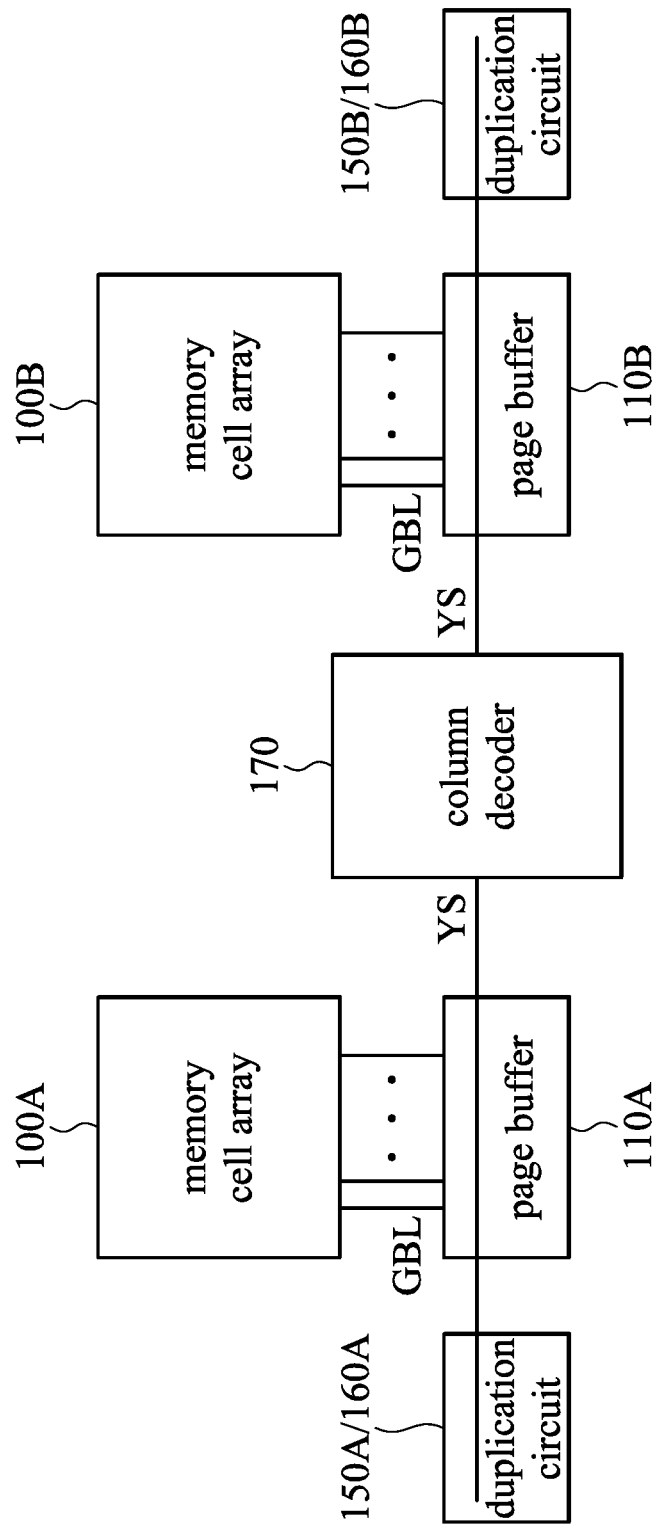
FIG. 3C shows a schematic diagram showing a configuration of a column decoder according to an exemplary embodiment.

In the embodiment of FIG. 3 the column selection signal YS output from the column decoder 170 extends from one side to the other side of the page buffer 110. However, as shown in FIG. 3C, the memory cell arrays 100A and 100B are composed of two-way banks, and the column decoder 170 is arranged in the middle thereof. In this case, the column selection signal YS is transmitted from the center in the direction of the left and right page buffers 110A and 110B. The duplication circuits 150A/160A and 150B/160B are disposed at the farthest ends of the page buffers 110 A and 110 B away from the column decoder 170, respectively.

Figure 1:
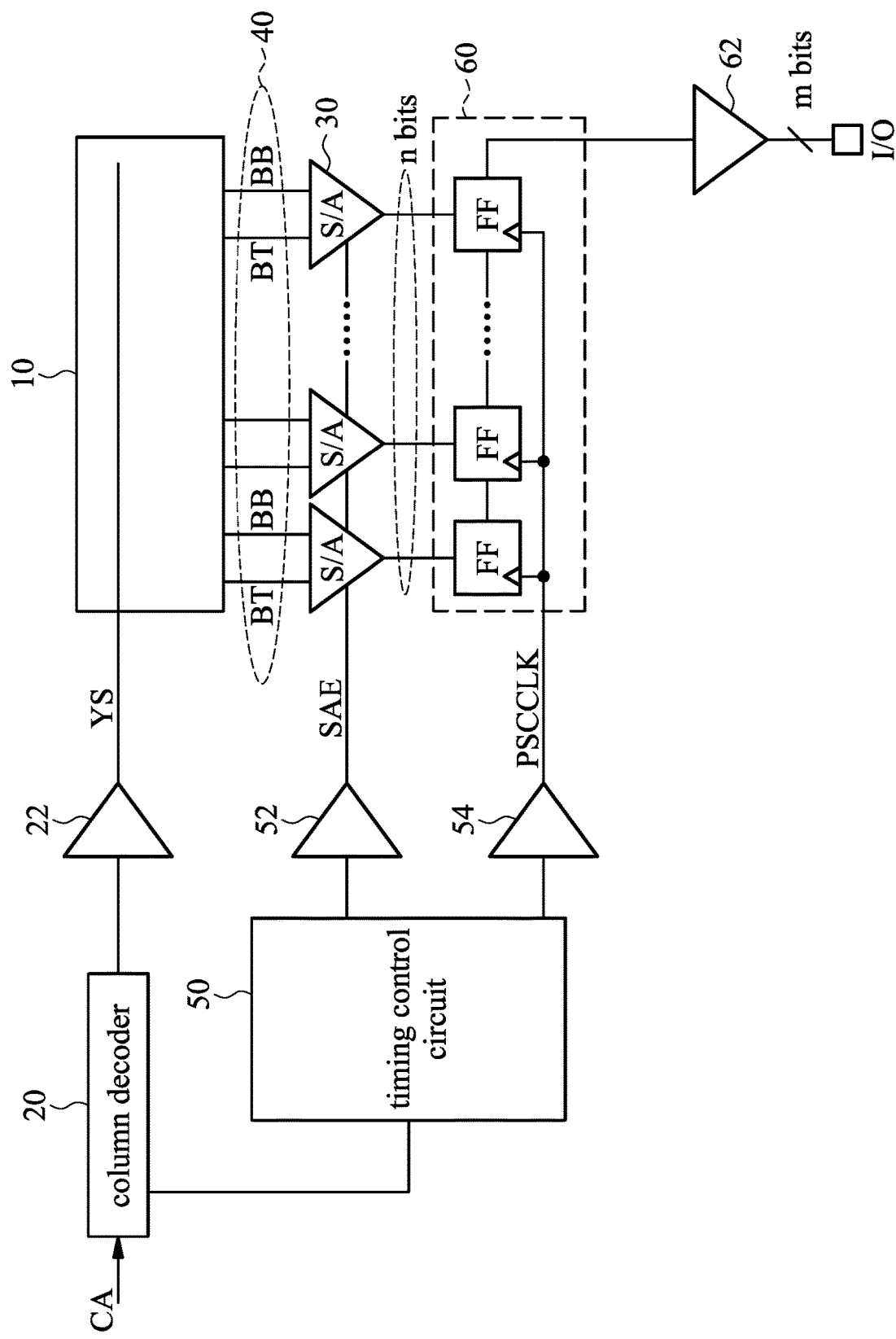
FIG. 1 is a schematic diagram showing a read operation of a conventional NAND flash memory.
Figure 2:
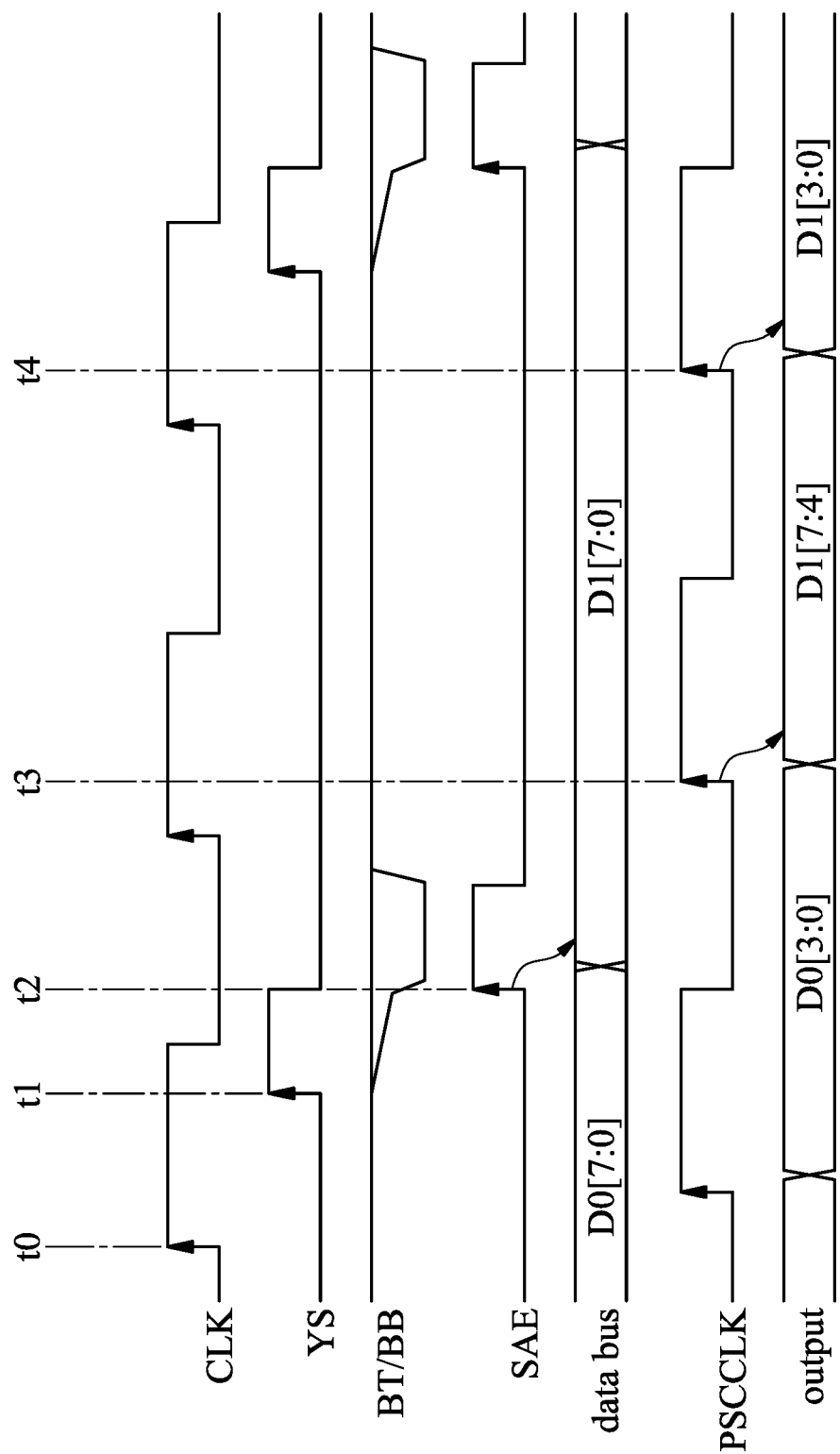
FIG. 2 shows a timing chart of a read operation of a conventional NAND flash memory.

Each bit-line pair BT/BB of the data buses 190 is connected to a corresponding differential sensing amplifier 200. As shown in FIG. 2, the differential sensing amplifiers 200 are enabled in response to the rising edge of the sensing enable signal SAE to sense the differential data on the data bus 190. The data sensed by the differential sensing amplifiers 200 is fetched by an input/output circuit (see FIG. 1), and is output to the outside via an input/output terminal.

As shown in FIG. 4, the timing control circuit 210 generates the sensing enable signal SAE through a driver 212 and receives a system clock signal CLK for controlling the entire operation. The timing control circuit 210 controls the timing of the column selection signal YS and enables the timing of the sensing enable signal SAE of the differential sense amplifiers 200 according to on the system clock signal CLK. The sensing enable signal SAE is generated at a predetermined time delayed from the column selection signal YS. The predetermined time is the time required for the bit-line pairs BT/BB of the data bus 190 to become greater than the predetermined potential difference.

FIG. 4 further shows a verification circuit used to verify the operation margin of the differential sensing amplifiers. The verification circuit 300 of the embodiment comprises duplication circuits 150 and 160, a differential sensing amplifier 200A, a differential sensing amplifier 200B, a judgement 310A, a judgement circuit 310B, a judgement circuit 320, a judgement result maintaining circuit 330, and a register 340. The differential sensing amplifier 200A senses the data which is output from the duplication circuit 150 to the data bus 190A. The differential sensing amplifier 200B senses the data from the duplication circuit 160 to the data bus 190B. The judgement circuit 310A judges whether data "1" maintained in the duplicating circuit 150 is sensed correctly. The judgement circuit 310B judges whether data "0" maintained in the duplicating circuit 160 is sensed correctly. The judgement circuit 320 judges whether the data "1" and "0" maintained in the two duplication circuits 150, 160 are correctly sensed based on the judgement results of the judgement circuits 310A and 310B. The judgement result maintaining circuit 330 maintains a plurality of judgement results each occurring when the timing of the sensing enable signal SAE is changed. The register is a nonvolatile register 340 for storing the judgement result maintained in the judgement result maintaining circuit 330.

The judgement circuit 310A comprises, for example, an EXOR (Exclusive OR) circuit whose one input terminal is supplied with the output of the differential sensing amplifier 200A and the other input terminal supplied with an H level. Since the duplication circuit 150 is used to maintain the data "1", if the output of the differential sensing amplifier 200A is also "1", the output of the EXOR circuit is "L". The case where the output of the differential sensing amplifier 200A is "0" indicates that the data maintained in the duplication circuit 150 is sensed incorrectly, and then the output of the EXOR circuit is "H".

Similarly, the judgement circuit 310B comprises an EXOR circuit whose one input is supplied with the output of the differential sensing amplifier 200B and the other input is supplied with an L level. Since the duplication circuit 160 is used to maintain the data "0", if the output of the differential sensing amplifier 200B is also "0", the output of the EXOR circuit is "L"; if it is not "0", the output of the EXOR circuit is "H".

The judgement circuit 320 comprises, for example, an OR circuit whose one input is supplied with the output of the judgement circuit 310A and the other input is supplied with the output of the judgement circuit 310B. If the data "1" and "0" output from the two duplication circuits 150 and 160 is correctly sensed by the differential sensing amplifiers 200A and 200B, the output of the OR circuit is "L"; if the data output from the two duplication circuits 150 and 160 is not correctly sensed, the output of the OR circuit is The judgement result maintaining circuit 330 is connected to the judgement circuit 320 to sequentially hold a plurality of judgement results output from the judgement circuit 320. The judgement result maintaining circuit 330 is implemented by, for example, a register which is formed by a plurality of flip-flops connected in series for Q bits. The judgement results of Q times performed by the judgement circuit 320 are input to the register serially, converted to a Q-bit parallel result (JUDGE), and then output to the register 340.

The register 340 is a nonvolatile register which maintains the Q-bit judgement result (JUDGE). For example, the register 340 can be a fuse ROM or a nonvolatile memory which records the Q-bit judgement result by the by using laser. The judgement result maintained in the register 340 is provided to the timing control circuit 210, and the timing control circuit 210 adjusts the timing of the sensing enable signal SAE based on the judgement result.

The flash memory further comprises a control unit (now shown in the drawings) (for example, a microcontroller and a state machine) for controlling the overall operation, and the control unit can control the operation of the verification circuit 300. In a preferred embodiment, during a testing operation before shipment of the flash memory, the control unit verifies the operation margin of the differential sensing amplifiers through the verification circuit 300 and then stores the verification result in the register 340. During the normal read operation of the flash memory after the shipment, the control unit adjusts the timing of the sensing enable signal SAE based on the verification result stored in the register 340.

Figure 5A:
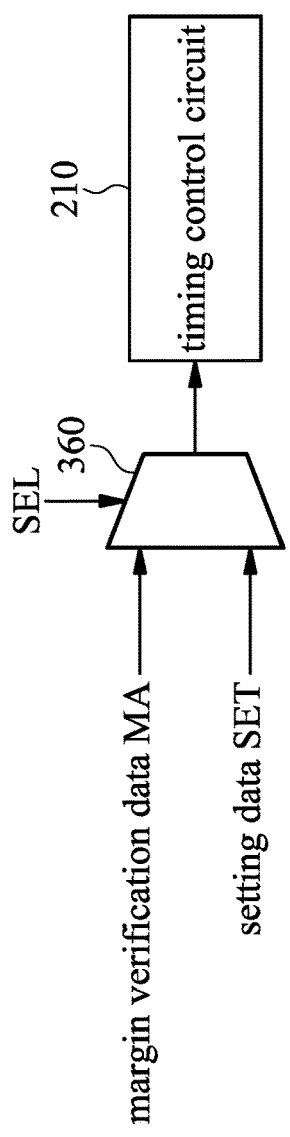
FIG. 5A is a schematic diagram showing an exemplary embodiment of selectively providing data to a timing controller circuit.

Next, the verification of the operation margin of the differential sensing amplifiers and an adjustment method thereof will be described with reference to FIG. 5 according to the present embodiment. First, as shown in FIG. 5A, the margin verification data MA or the setting data is input to the timing control circuit 210 from the selector 360. During the test operation or the verification of the operation margin of the differential sensing amplifiers, the control unit controls the selector 360 according to a selection control signal SEL so that the margin verification data MA is input to the timing control circuit 210. The margin verification data MA is information which is used for defining the timing of the sensing enable signal SAE during the verification of the operation margin of the differential sensing amplifiers. In this example, the margin verification data is directly expressed by the memory address "0h", "1h", . . . , or "6h". The time information for defining the timing of the sensing enable (for example, the delay time from the column selection signal, or pulse information for generating the sensing enable signal) is stored in the memory address. The control units read the margin verification data MA stored in the address and provides it to the timing control circuit 210. The timing control circuit 210 generates the sensing enable signal SAE according to the received margin verification data.

In this example, the delay time from the rising edge of the column selection signal YS to the rising edge of the sensing enable signal SAE is controlled according to seven kinds of timings stored in the memory addresses "0h"~"6h" for the verification of the operation margin. In addition, the delay time from the rising edge of the column selection signal YS to the rising edge of the sense enable signal SAE increases from the memory address "0h" to the memory address "6h".

Figure 5B:
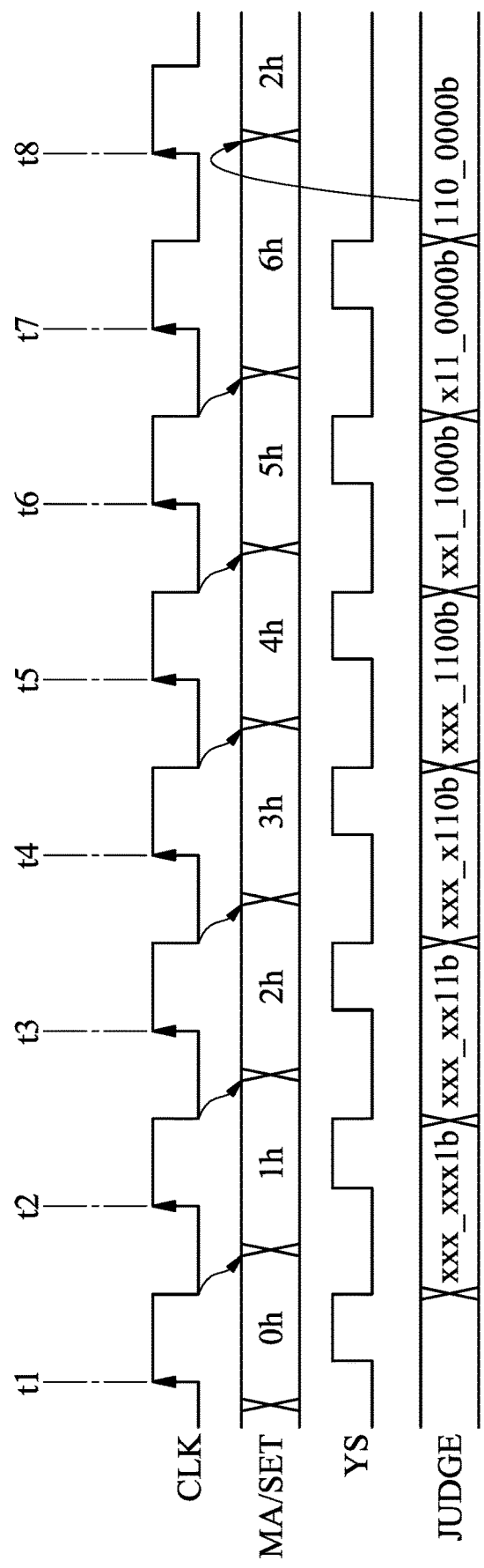
FIG. 5B is a schematic diagram showing a margin verification of the differential sensing amplifiers of the flash memory in the first embodiment and a timing chart of adjustment of sensing enable signals based on a verification result.

As shown in FIG. 5B, at time t1, the system clock signal CLK rises, and the column selection signal YS rises after a predetermined time from time t1. The timing control circuit 210 generates the sensing enable signal SAE based on the margin verification data MA stored in the memory address "0h". The differential sensing amplifiers sense data on the data bus 190 in response to the rising edge of the sensing enable signal SAE. The verification circuit 300 judges whether the data output from the duplication circuits 150 and 160 farthest from the output node of the column selection signal YS is correctly sensed. In the cases where the sensing enable signal SAE is generated based on the margin verification data MA corresponding to the memory address "0h", if the data output from the duplication circuits 150 and 160 is not correctly sensed, "xxx-xxx1b" is maintained in the judgement result maintaining circuit 330, wherein the data "1" indicating that the data is not sensed correctly is maintained in the least significant bit. The data "x" indicates that it has not judged yet.

The differential sensing amplifiers are reset in response to the next rising edge of the system clock signal CLK. After a predetermined time after time t2, the column selection signal YS rises, the timing control circuit 210 generates the sensing enable signal SAE based on the margin verification data MA stored in the memory address "1h". The differential sensing amplifiers sense data on the data bus in response to the rising edge of the sensing enable signal SAE. In the embodiment, the verification circuit 300 judges that the data output from the two duplication circuits 150 and 160 is not correctly sensed, too. Therefore, the judgement result maintaining circuit 330 shifts the judgement result one time and maintains "xxx-xx11b".

The differential sensing amplifiers are reset in response to the next rising edge of the system clock signal CLK (at time 3). After a predetermined time from time t3, the column selection signal YS rises, the timing control circuit 210 generates the sensing enable signal SAE based on the margin verification data MA stored in the memory address "2h". The differential sensing amplifiers sense data on the data bus in response to the rising edge of the sensing enable signal SAE. In the embodiment, the verification circuit 300 judges that the data output from the two duplication circuits 150 and 160 can be correctly sensed. Therefore, the judgement result maintaining circuit 330 outputs data "0" indicating that the data can be sensed correctly, and "xxx-x110b" is maintained in the judgement result maintaining circuit 330.

Similarly, the verification of the operation margin of the differential sensing amplifiers is performed according to the margin verification data MA stored in the memory addresses "3h"~"6h" after a predetermined time from each of time t4~t7. With the delaying of the rising timing of the sensing enable signal SAE is, the potential difference of the data bus 190 becomes larger. Thus, according to the verification of the operation margin performed based on the margin verification data MA stored in the memory addresses following "3h", the verification circuit 300 judges that the data of the output from the duplication circuits 150 and 160 can be sensed correctly. Finally, the judgment result maintaining circuit 330 maintains the judgment result "110_0000b", which is obtained at seven different timings, as a 7-bit code. The code comprises the timing boundary information of the sensing enable signal SAE which can sense the data correctly. After the completion of the margin verification, the control unit stores the data maintained in the judgement result maintaining circuit 330 in the register 340.

During the normal operation of the flash memory, the control unit selects the setting data SET maintained in the register 340 through the selector 360 according to the selection control signal SEL and then provides the setting data SET to the timing control circuit 210. The timing control circuit 210 sets the timing of the sensing enable signal SAE as the timing specified by the margin verification data MA stored in the memory address "2h" based on the setting data "110_0000b". Since the duplication circuits 150 and 160 realizes the worst sensing characteristic, the face that duplication circuits 150 and 160 can sense data correctly guarantees that all the data in the main area of the page buffer can be sensed correctly.

Next, a second embodiment of the present invention will be described. In the first embodiment, the operation margin of the differential sensing amplifiers are verified in advance and then the sensing enable signal is adjusted or set based on the verification result. However, in the second embodiment, the previous verification or test is not required. According to the second embodiment, the verification or test for the operation margin of the differential sensing amplifiers is performed during the normal read operation and then the timings of the differential sensing amplifiers is automatically adjusted or set based on the verification result.

Figure 6:
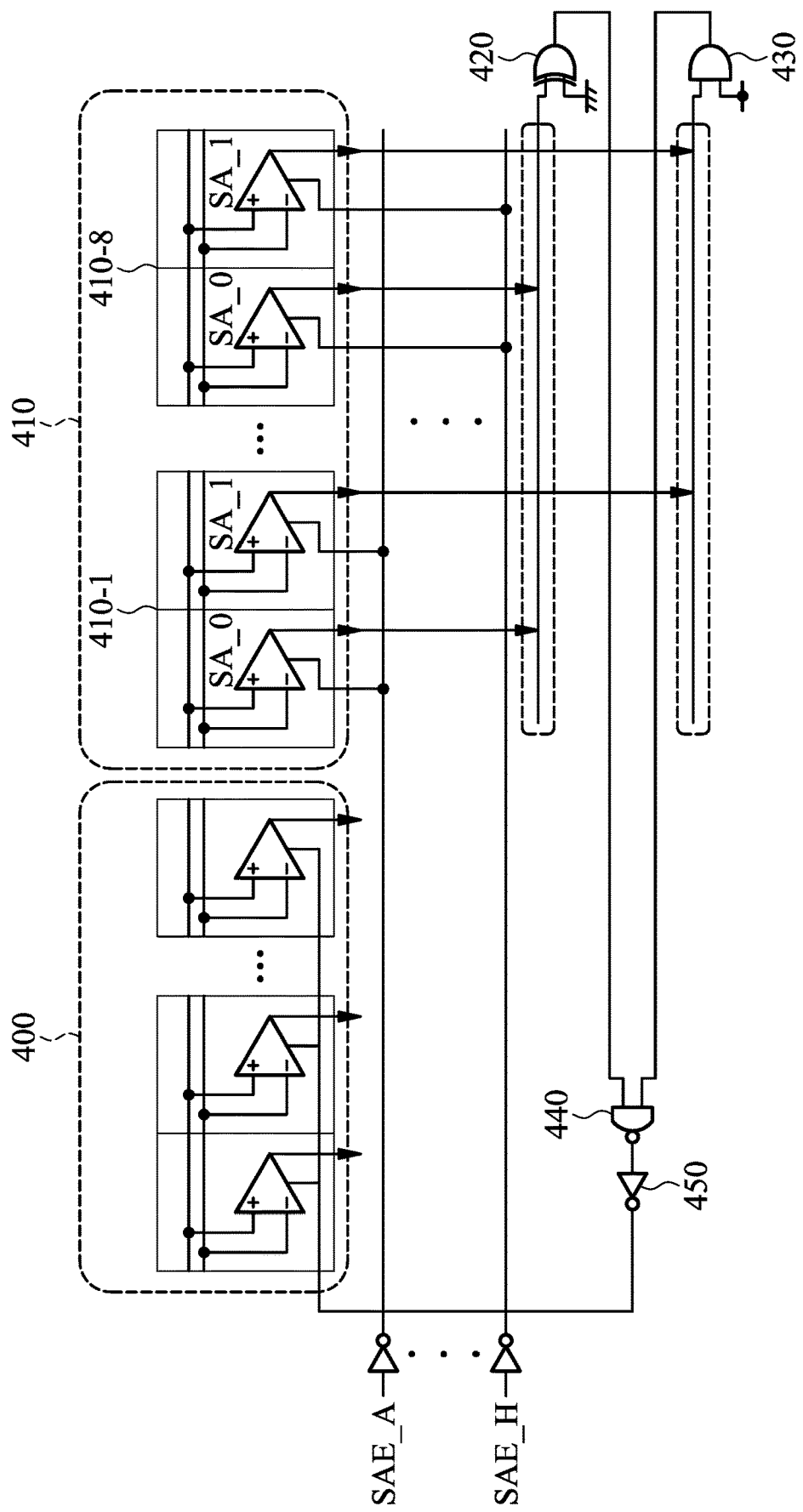
FIG. 6 shows a schematic diagram showing a structure of a flash memory related to a read operation according to a second embodiment of the present invention.

FIG. 6 shows a schematic diagram showing a structure related to a read operation of a flash memory according to a second embodiment. In the present embodiment, a plurality of sets of duplication circuits 150 and 160 corresponding to the precision of the verification of the operation margin of the differential sensing amplifier are configured. The precision corresponds to the Q bits in the first embodiment. When the operation margin is analyzed with Q bits, Q sets of duplication circuits 150-1~150-Q and 160-1~160-Q are prepared. In the following description, it is assumed that the operation margin is analyzed with 8 bits, and 8 sets of duplication circuits are prepared.

In the second embodiment, as shown in FIG. 6, the verification circuit comprises differential sensing amplifiers 400 and different sensing amplifiers 410. The differential sensing amplifiers 400 sense differential data which is output from the main area of the page buffer 110 to the data bus. The differential sensing amplifiers 410 sense differential data which is output from the eight sets of duplication circuits maintaining data "0" and "1" to the data bus. The differential sense amplifiers 410 comprise eight differential sensing amplifiers 410-1~410-8. That is, it is composed of 16 differential sensing amplifiers.

Each of the differential sensing amplifiers 410-1~410-8 comprises a differential sensing amplifier SA_0 which senses the data output from the duplication circuit maintaining the data "0" and a differential sensing amplifier SA_1 which senses the data output from the duplication circuit maintaining the data "1". Each of the differential sensing amplifiers 410-1~410-8 is enabled in response to the sensing enable signals SAE_A, SAE_B, . . . , SAE_H, respectively, to sense the differential data maintained by the corresponding duplication circuits. In a preferred embodiment, the control unit (not shown) controls the timing control circuit 210 during the read operation, so that the sensing enable signals SAE_A~SAE_H having different timings can be provided to the differential sensing amplifiers 410-1~410-8.

The verification circuit of the embodiment further comprises a judgement circuit 420 for judging whether the data output from the duplication circuit maintaining the data "0" is sensed correctly. In the example of the drawings, the judgement circuit 420 comprises an EXOR (Exclusive OR) circuit whose one input terminal is supplied with the output of the differential sensing amplifiers SA_0 and the other input terminal supplied with a ground level corresponding to a logic value "0". The verification circuit further comprises a judgement circuit 430 for judging whether the data output from the duplication circuit maintaining the data "1" is sensed correctly. In the example of the drawings, the judgement circuit 430 comprises an AND circuit whose one input terminal is supplied with the output of the differential sensing amplifiers SA_1 and the other input terminal us supplied with a voltage corresponding to a logic value "1".

The verification circuit further comprises a judgement circuit 440 for judging the sensing enable signals SAE_A-~SAE_H for correct sensing data according to the judgement result of the judgement circuit 420 and the judgement result of the judgement circuit 430. The judgement circuit 440 comprises, for example, a NAND circuit which receives the output of the judgement (EXOR) circuit 420 and the output of the judgement (AND) circuit 430. The verification circuit further comprises a driving circuit 450 for enabling the differential sense amplifiers 400 based on the judgement result of the judgement circuit 440. The driving circuit 450 comprises, for example, an inverter connected to the output of the judgement (NAND) circuit. The output of the inverter is connected to each of the differential sensing amplifiers 400. Note that the logic circuits configured to form the judgement circuits 420, 430, and 440 are merely examples, and these circuits are not limited to be implemented by specific logical circuits. For example, the judgement circuit 420 for judging the data "0" may be implemented by an OR circuit, the judgement circuit 430 for judging the data "1" may be implemented by an EXOR circuit. Each of the judgement circuits 420 and 430 may be implemented by a logic circuit other than the above logic circuits or by a combination of a plurality of logic circuits.

Figure 7:
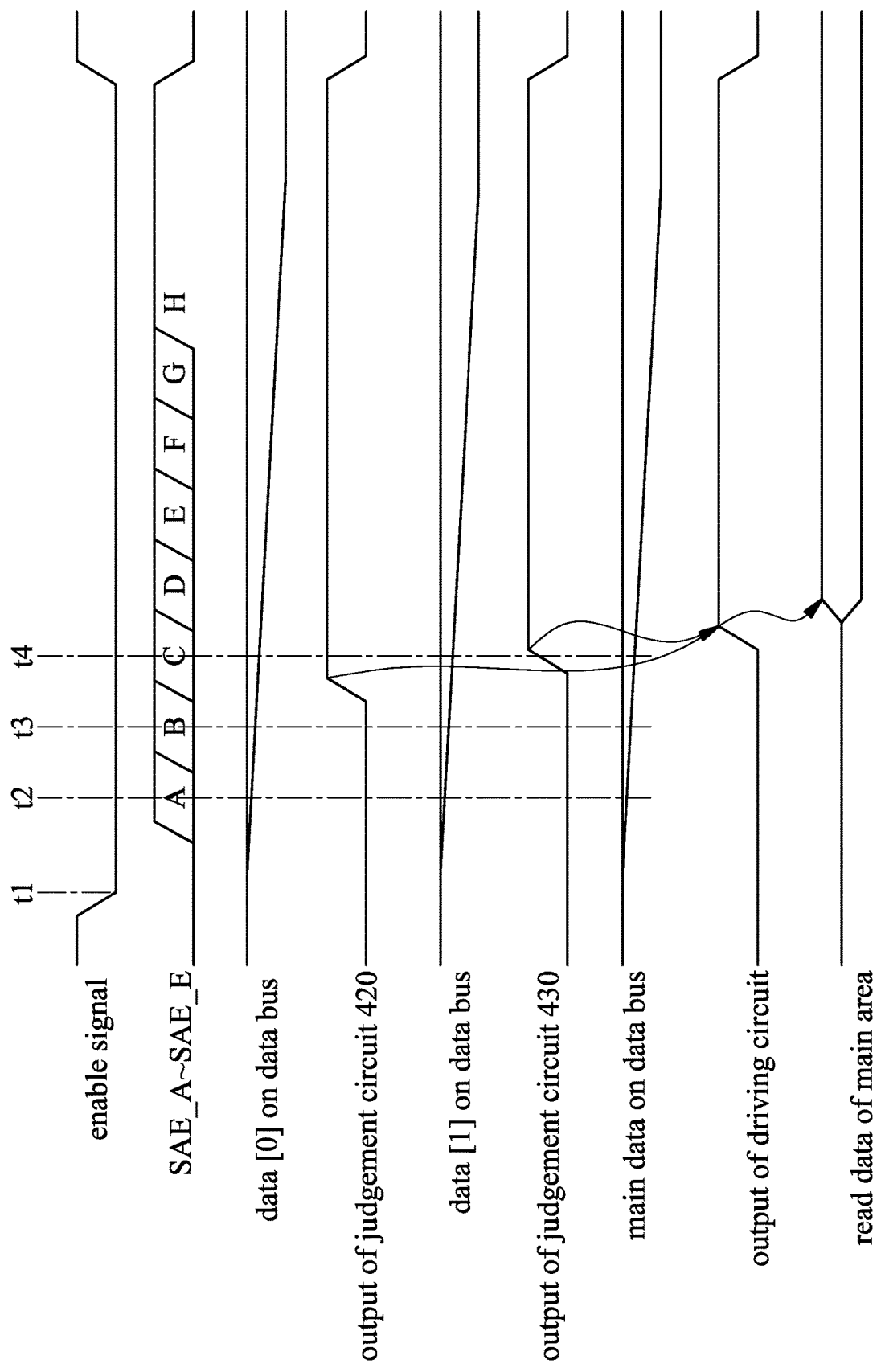
FIG. 7 shows a timing chart of automatic generation of sensing enable signals according to the second embodiment of the present invention.

Next, the operation of the second embodiment of the present invention will be described with reference to the timing chart of FIG. 7. During the read operation, the word line of the memory cell array 100 is selected according to the row address, the data of the memory cells is read out and maintained in the page buffer 110. At time t1, the enabling for the data maintained in the page buffer 110 to be output to the data bus is asserted, and the data is output from the page buffer 110 to the data bus in response to the column selection signal.

At time t2, the timing control circuit 210 outputs the sensing enable signal SAE_A to the differential sensing amplifier 410-1, and the differential sensing amplifier 410-1 senses the data on the data bus in response to the rising edge of the sensing enable SAE_A. This sensing result is judged by the judgement circuits 420 and 430. In the embodiment, the differential sensing amplifier 410-1 cannot correctly sense the data maintained in the corresponding duplication circuits, the output of the judgement circuit 440 is at an "H" level, the output of the driving circuit 450 is at an "L" level, and the differential sensing amplifiers 400 for the main area remain deactivated.

At time t3, the timing control circuit 210 outputs the sensing enable signal SAE_B to the differential sensing amplifier 410-2, and the differential sensing amplifier 410-2 senses the data on the data bus in response to the rising edge of the sensing enable signal SAE_B. The sensing enable signal SAE_B is obtained by delaying the timing of the sensing enable signal SAE_A by a predetermined time (for example, the time from the column selection signal YS). In the embodiment, the differential sensing amplifier 410-2 cannot correctly sense the data maintained in the corresponding duplication circuits.

At time t4, the timing control circuit 210 outputs the sensing enable signal SAE_C which is delayed from the sensing enable signal SAE_B by a predetermined time to the differential sensing amplifier 410-3, and the differential sensing amplifier 410-3 senses the data on the data bus in response to the rising edge of the sensing enable SAE_C. Here, the differential sensing amplifier 410-3 correctly senses the data which is output by the duplicating circuit maintaining the data "0" and the duplication circuit maintaining the data "1" to the data bus. In this case, the OR circuit of the judgement circuit 420 outputs an H level, the AND circuit of the judgement circuit 430 outputs an H level, the NAND circuit of the judgement circuit 440 outputs an L level, and the inverter of the driving circuit 450 drives the enable signal of the differential sensing amplifiers 400 to an H level. As a result, the differential sensing amplifiers 400 senses the data of the main area on the data bus and outputs the sensed data to the outside.

As described above, during the read operation, the verification circuit of the present embodiment enables the differential sensing amplifiers 410 by using the sensing enable signals SAE_A~SAE_H, which are generated in different timings, to sense the data output by a plurality of sets of duplication circuits 150 and 160. Thus, the verification circuit can judge and set the timings by itself for enabling the differential sensing amplifiers 400.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device comprising:
   a maintaining circuit configured to maintain data read from a memory cell array and output the data to a data bus in response to a column selection signal;
   a sensing circuit configured to sense the data on the data bus in response to at least one sensing enable signal;
   an output circuit configured to output the data sensed by the sensing circuit; and
   a verification circuit configured to verify an operation margin of the sensing circuit and output a verification result,
   wherein a timing of the at least one sensing enable signal is set according to the verification result of the verification circuit.

2. The semiconductor memory device as claimed in claim 1, wherein the verification circuit comprises at least one duplication circuit which is arranged at a farthest end where a distance from an output node of a column selection signal is the longest; wherein the at least one duplication circuit outputs data maintained therein to the data bus in response to the column selection signal; and wherein the verification circuit generates the verification result according to at least one sensing result of the data output from the at least one duplication circuit.

3. The semiconductor memory device as claimed in claim 2, wherein the verification circuit further comprises a judgement circuit for judging whether the at least one sensing result is equal to the data maintained in the at least one duplication circuit and outputs a judgement result, and wherein the verification circuit generates the verification result according to the judgement result of the judgement circuit.

4. The semiconductor memory device as claimed in claim 2, wherein the verification circuit further comprises at least one verification sensing circuit configured to sense the data on the data bus output from the at least one duplication circuit in response to more than one sensing enable signal having different timings and generates more than one sensing result; and wherein the verification circuit generates the verification result according to the sensing results.

5. The semiconductor memory device as claimed in claim 4, wherein the verification circuit further comprises a storage element configured to store the sensing results; and wherein timings of the sensing enable signals are set according to the sensing results stored in the storage element.

6. The semiconductor memory device as claimed in claim 4, wherein the verification circuit comprises more than one duplication circuit and more than one verification sensing circuit, and the verification sensing circuits sequentially sense the data of the duplication circuits respectively in response to the sensing enable signals and sequentially generate the sensing results; and wherein when one of the sensing results is equal to the data maintained in the corresponding duplication circuit, the verification result output by the verification circuit enables the sensing circuit.

7. The semiconductor memory device as claimed in claim 2, wherein the verification circuit operates during a test operation, wherein the verification circuit further comprises a nonvolatile register configured to store the verification result; wherein the semiconductor memory device further comprises a control circuit configured to set the timing of the at least one sensing enable signal according to the verification result stored in the nonvolatile register during a normal operation.

8. The semiconductor memory device as claimed in claim 7, further comprising:
   a selector receiving margin verification data and setting data and outputting the margin verification data or the setting data in response to a selection control signal; and
   a timing control circuit receiving an output from the selector and generating the at least one sensing enable signal,
   wherein the margin verification data is stored in the memory cell array or in a test circuit or provided from the outside, and the setting data is stored in the nonvolatile register.

9. The semiconductor memory device as claimed in claim 2, wherein the at least one duplication circuit comprises a memory element configured to maintain predetermined data irrespective of the memory cell array.

10. The semiconductor memory device as claimed in claim 2, wherein the at least one duplication circuit comprises a memory element configured to maintain data read from the memory cell array.

11. The semiconductor memory device as claimed in claim 2, wherein the at least one duplication circuit comprises a first latch circuit maintaining data "0" and a second latch circuit maintaining data "1".

12. The semiconductor memory device as claimed in claim 1, wherein the timing is a time by which the at least one sensing enable signal is delayed from the column selection signal.

13. The semiconductor memory device as claimed in claim 1, wherein the semiconductor memory device is a NAND flash memory.

* * * * *